US012417958B2

(12) United States Patent
Nofen et al.

(10) Patent No.: US 12,417,958 B2
(45) Date of Patent: Sep. 16, 2025

(54) MICROELECTRONICS PACKAGE COMPRISING A PACKAGE-ON-PACKAGE (POP) ARCHITECTURE WITH INKJET BARRIER MATERIAL FOR CONTROLLING BONDLINE THICKNESS AND POP ADHESIVE KEEP OUT ZONE

(71) Applicant: Intel Corporation, Santa Clara, CA (US)

(72) Inventors: Elizabeth Nofen, Phoenix, AZ (US); Shripad Gokhale, Gilbert, AZ (US); Nick Ross, Chandler, AZ (US); Amram Eitan, Scottsdale, AZ (US); Nisha Ananthakrishnan, Chandler, AZ (US); Robert M. Nickerson, Chandler, AZ (US); Purushotham Kaushik Muthur Srinath, Chandler, AZ (US); Yang Guo, Chandler, AZ (US); John C. Decker, Tempe, AZ (US); Hsin-Yu Li, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 18/399,205

(22) Filed: Dec. 28, 2023

(65) Prior Publication Data

US 2024/0128152 A1   Apr. 18, 2024

Related U.S. Application Data

(63) Continuation of application No. 18/374,587, filed on Sep. 28, 2023, which is a continuation of application
(Continued)

(51) Int. Cl.
*H01L 23/373* (2006.01)
*H01L 21/02* (2006.01)
(Continued)

(52) U.S. Cl.
CPC ...... *H01L 23/373* (2013.01); *H01L 21/02288* (2013.01); *H01L 21/565* (2013.01); *H01L 21/76816* (2013.01); *H01L 23/481* (2013.01)

(58) Field of Classification Search
CPC ....... H01L 2224/32145; H01L 25/0657; H01L 23/42
See application file for complete search history.

(56) References Cited

U.S. PATENT DOCUMENTS 5,907,903 A * 6/1999 Ameen ................. H01R 12/52
361/744
9,287,240 B2 * 3/2016 Li ....................... H01L 23/5385
(Continued)

FOREIGN PATENT DOCUMENTS

CN   109641739       4/2019
CN   109641739 A *  4/2019  ............ B81B 7/007
(Continued)

OTHER PUBLICATIONS

Office Action from U.S. Appl. No. 16/557,784, mailed Oct. 31, 2023, 19 pages.
(Continued)

*Primary Examiner* — Edward Chin
(74) *Attorney, Agent, or Firm* — Schwabe, Williamson & Wyatt P.C.

(57) ABSTRACT

Embodiments disclosed herein include electronic packages. In an embodiment, the electronic package comprises a first package, wherein the first package comprises, a first package substrate, a first die over the first package substrate, a first mold layer over the first package substrate and around the first die, and a plurality of through mold interconnects (TMIs) through the first mold layer. The electronic package may further comprise a second package electrically coupled the first package by the TMIs, wherein the second package comprises a second package substrate, a second die over the
(Continued)

second package substrate, and a solder resist over a surface of the second package substrate opposite from the second die. In an embodiment, the electronic package may also comprise a barrier between the first package and the second package.

14 Claims, 9 Drawing Sheets

Related U.S. Application Data

No. 18/372,542, filed on Sep. 25, 2023, which is a continuation of application No. 16/557,784, filed on Aug. 30, 2019.

(51) Int. Cl.
*H01L 21/56* (2006.01)
*H01L 21/768* (2006.01)
*H01L 23/48* (2006.01)

(56) References Cited

U.S. PATENT DOCUMENTS

| | | | | |
|---|---|---|---|---|
| 10,083,891 | B1* | 9/2018 | Graf | H01L 25/16 |
| 10,459,148 | B1* | 10/2019 | Yoon | G02B 6/0036 |
| 10,879,192 | B1* | 12/2020 | Kuan | H01L 23/5385 |
| 2007/0190691 | A1* | 8/2007 | Humpston | H01L 27/14618 |
| | | | | 438/464 |
| 2011/0227209 | A1* | 9/2011 | Yoon | H01L 23/3128 |
| | | | | 438/109 |
| 2013/0056864 | A1* | 3/2013 | Cho | H01L 23/49833 |
| | | | | 257/713 |
| 2015/0115424 | A1* | 4/2015 | Riviere | H01L 25/105 |
| | | | | 257/675 |
| 2016/0181567 | A1* | 6/2016 | Kim | H10K 50/841 |
| | | | | 438/26 |
| 2016/0329261 | A1* | 11/2016 | Hung | H01L 23/3675 |
| 2016/0358839 | A1* | 12/2016 | Kuczynski | B29C 48/2886 |
| 2017/0236819 | A1* | 8/2017 | Kanai | H01L 29/872 |
| | | | | 257/77 |
| 2018/0061816 | A1* | 3/2018 | Kim | H01L 23/3675 |
| 2018/0315733 | A1* | 11/2018 | Lin | H01L 24/14 |
| 2018/0342466 | A1* | 11/2018 | Lin | H01L 21/56 |
| 2019/0006319 | A1* | 1/2019 | Karhade | H01L 23/3135 |
| 2019/0198430 | A1* | 6/2019 | Takano | H01L 21/4853 |
| 2019/0206824 | A1* | 7/2019 | Lu | H01L 24/20 |
| 2019/0206839 | A1* | 7/2019 | Balakrishnan | H01L 25/18 |
| 2019/0388688 | A1* | 12/2019 | Fan | A61N 1/37223 |
| 2020/0152656 | A1* | 5/2020 | Lee | H10B 43/35 |
| 2021/0057297 | A1* | 2/2021 | Chen | H01L 23/49816 |
| 2021/0066273 | A1* | 3/2021 | Myasishchev | H01L 25/18 |
| 2021/0272867 | A1* | 9/2021 | Tanaka | H01L 29/739 |
| 2022/0020664 | A1* | 1/2022 | Lee | H01L 25/0657 |
| 2022/0077115 | A1* | 3/2022 | Otsuka | H01L 24/49 |
| 2022/0165635 | A1* | 5/2022 | Park | H01L 25/18 |
| 2022/0238541 | A1* | 7/2022 | Byun | H10N 19/00 |
| 2022/0278067 | A1* | 9/2022 | Tseng | H01L 23/585 |

FOREIGN PATENT DOCUMENTS

| | | | |
|---|---|---|---|
| JP | 2019114757 | 7/2019 | |
| JP | 2019114757 A | * 7/2019 | H01L 21/4853 |

OTHER PUBLICATIONS

Office Action from U.S. Appl. No. 16/557,784, mailed Mar. 26, 2024, 22 pages.
Final Office Action from U.S. Appl. No. 16/557,784, mailed Aug. 23, 2024, 21 pages.
Office Action from U.S. Appl. No. 18/374,587, mailed Nov. 14, 2024, 17 pages.

* cited by examiner

MICROELECTRONICS PACKAGE COMPRISING A PACKAGE-ON-PACKAGE (POP) ARCHITECTURE WITH INKJET BARRIER MATERIAL FOR CONTROLLING BONDLINE THICKNESS AND POP ADHESIVE KEEP OUT ZONE

CROSS-REFERENCE TO RELATED APPLICATIONS

This application is a continuation of U.S. patent application Ser. No. 18/374,587, filed Sep. 28, 2023, which is a continuation of pending U.S. patent application Ser. No. 18/372,542, filed Sep. 25, 2023, which is a continuation of pending U.S. patent application Ser. No. 16/557,784, filed Aug. 30, 2019, the entire contents of which are hereby incorporated by reference herein.

TECHNICAL FIELD

Embodiments of the present disclosure relate to semiconductor devices, and more particularly to barriers disposed between a top package and a bottom package of a package-on-package (PoP) architecture.

BACKGROUND

Thermal performance is a critical concern in many advanced packaging architectures. In particular, package-on-package (PoP) architectures require careful consideration of thermal performance since the underlying package (e.g., a system-on-chip (SoC) package) is entirely covered by the top package (e.g., a memory package). Accordingly, the path for thermal dissipation from the SoC is up through the memory package. However, the thermal path has a high thermal resistance because there is typically an air gap between the top package and the bottom package. Currently, thermal interface materials are not included between the two packages because there is no way to control the flow of the material. That is, if a thermal interface material was disposed between the two packages, the thermal interface material would spread and bleed into the through mold interconnect (TMI) joints, which would lead to solder extrusion.

Some solutions to the spreading of an interface material have been proposed. For example, solder resist dams may be used to confine a thermal interface material. However, the creation of the dam requires complex substrate processing, including lithography. This limits when the dam can be formed. That is, the dam must be formed during substrate manufacturing, and before any ball attach (BA) step, since the solder resist dam would impede BA paste printing.

EMBODIMENTS OF THE PRESENT DISCLOSURE

Figure 1A:
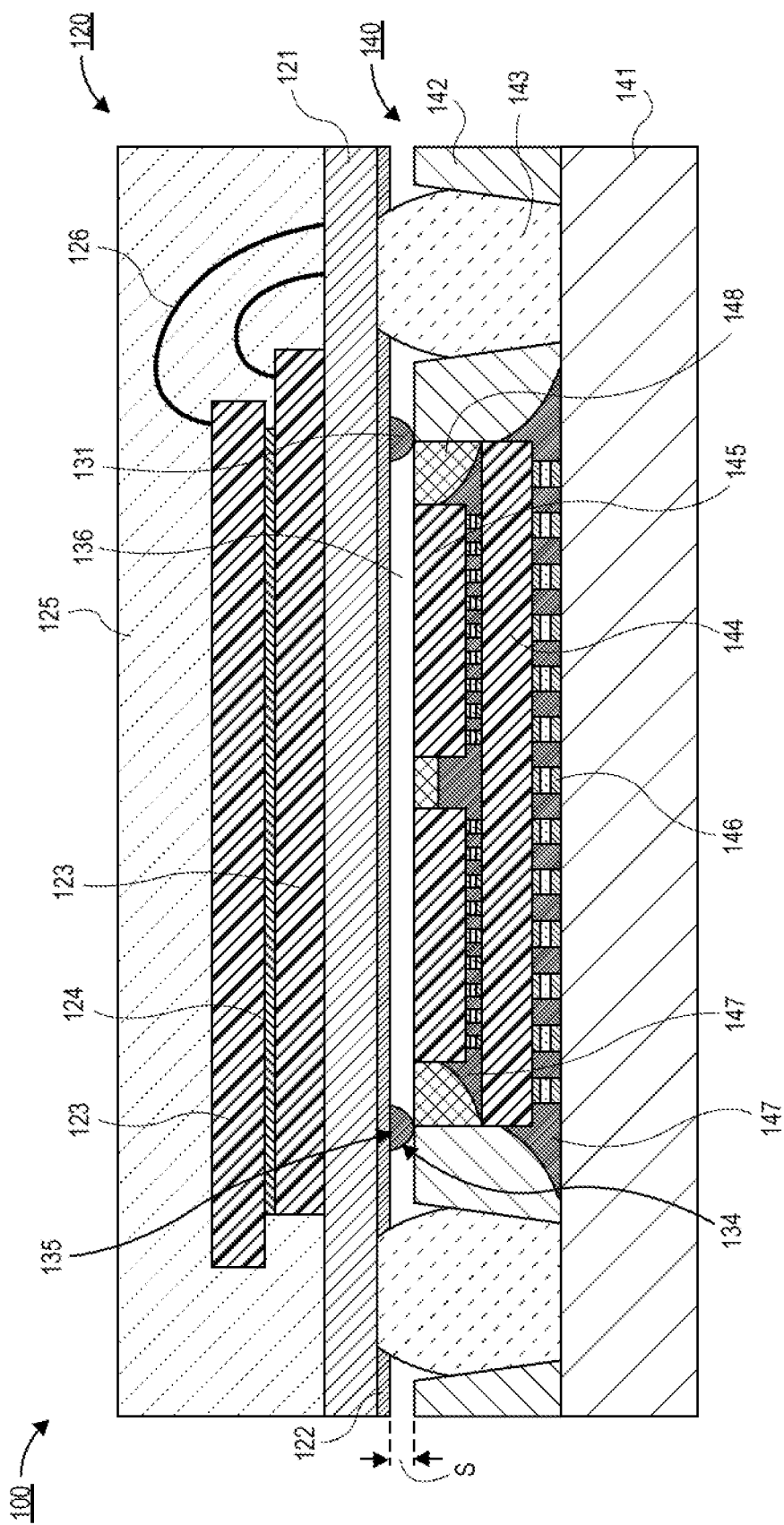
FIG. 1A is a cross-sectional illustration of an electronic package with a package-on-package (PoP) architecture that includes a barrier between a first package and a second package, in accordance with an embodiment.

Described herein are electronic packages with barriers disposed between a top package and a bottom package of a package-on-package (PoP) architecture, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal performance of PoP systems is limited due in part to the air gap between the bottom package and the top package Filling the air gap with a thermal interface material has not been widely adopted because the deposited thermal interface material will flow into the through mold interconnect (TMI) region. Solder resist dams have also not been a practical solution.

Accordingly, embodiments disclosed herein include a barrier that is disposed between the first package and the second package. The barrier may be disposed with a printing process (e.g., ink jet printing). As such, the barrier may be disposed over the first package and/or the second package at any point in the assembly. This allows for standard packages to be obtained from the supplier and later modified to include the barrier immediately prior to PoP assembly.

In an embodiment, the barrier provides a boundary that prevents a thermal adhesive from spreading uncontrollably. Therefore, the air gap between the first package and the second package may be filled by a thermal adhesive material without the concern of the material spreading to the TMI region. This reduces the thermal resistance along the path from the first package to the second package, and therefore, improves performance of the system. The barrier may also provide a boundary that keeps flux from the TMI region out of the die region.

In an embodiment, the barrier may also be used as a bondline thickness (BLT) control mechanism. Without a BLT control mechanism, process variation may result in reductions in yield. For example, lack of BLT control may result in solder bump bridging in the TMI region. Accordingly, precisely controlling the BLT with a barrier improves yield.

Referring now to FIG. 1A, a cross-sectional illustration of an electronic package 100 is shown, in accordance with an embodiment. In an embodiment, the electronic package 100 has a PoP architecture. That is, the electronic package 100 may comprise a first package 140 (also referred to as a bottom package 140) and a second package 120 (also referred to as a top package 120). In some embodiments, the first package 140 may be a system-on-a-chip (SoC) package, and the second package 120 may be a memory package.

In an embodiment, the first package 140 comprises a package substrate 141. The package substrate 141 may include a plurality of organic buildup layers with conductive routing (e.g., traces, vias, pads, etc.). A first die 144 may be coupled to the package substrate 141. For example, first level interconnects (FLIs) 146 or any other suitable interconnect architecture may be used to couple the first die 144 to the package substrate 141. In some embodiments, the first package 140 may further comprise a plurality of second dies 145. The second dies 145 may be coupled to the first die 144 by FLIs 146 or other suitable interconnects. In an embodiment, the first die 144 may include transistors fabricated at a first process node and the second dies 145 may include transistors fabricated at a second process node that is more advanced than the first process node. In an embodiment, capillary underfill (CUF) 147 may be disposed around the FLIs 146 of the first die 144 and the second dies 145.

In an embodiment, the first package 140 may comprise a first mold layer 142. The first mold layer 142 is over the package substrate 141 and surrounds the first die 144. In an embodiment, a second mold layer 148 may embed the second dies 145. Other embodiments may include embedding the first die 144 and the second dies 145 with the first mold layer 142. In an embodiment, through mold interconnects (TMIs) 143 may pass through the first mold layer 142. The TMIs 143 may be electrically coupled to the first die 144 and the second dies 145 by conductive paths (not shown) through the package substrate 141.

In an embodiment, the second package 120 may be electrically coupled to the first package 140 by the TMIs 143. For example, the TMIs 143 may pass through a solder resist layer 122 of the second package 120 and land on conductive pads (not shown) of a package substrate 121. In an embodiment, the second package 120 may include one or more dies 123. For example a pair of dies 123 are shown in FIG. 1A, but it is to be appreciated that any number of dies 123 may be used in accordance with various embodiments. The dies 123 may be stacked over each other in some embodiments. A die attach film (DAF) 124 may couple dies 123 together. In an embodiment, the dies 123 may be offset from each other to allow for wire bonds 126 to electrically couple the dies 123 to the package substrate 121. The wire bonds 126 may be electrically coupled to the TMIs 143 by conductive routing (not shown) through the package substrate 121. In an embodiment, a mold layer 125 may be used to embed the dies 123.

In an embodiment, the first package 140 is spaced away from the second package 120 by a spacing S. The spacing S represents the BLT between the first package 140 and the second package 120. In an embodiment, the spacing S may be approximately 10 µm or greater. In a particular embodiment, the spacing S may be approximately 25 µm or greater. Control of the spacing S may be provided by a barrier 131. The barrier 131 may be an ink barrier that is printed onto either the first package 140 or the second package 120. In an embodiment, the barrier 131 comprises a polymeric material. For example, the barrier 131 may comprise acrylic polymers. Additional embodiments may also comprise $TiO_2$ particles. The barrier 131 may be a UV curable material. Accordingly, the barrier 131 may be printed and subsequently cured to provide mechanical rigidity needed to control the BLT.

In an embodiment, the barrier 131 defines an air gap 136 between the first package 140 and the second package 120. In an embodiment, the air gap 136 is positioned over the first die 144 and the second dies 145. In a particular embodiment, the barrier 131 may contact the first package 140 along the first mold layer 142 or the second mold layer 148. The barrier 131 may contact the second package 120 along the solder resist 122. For example, a first surface 135 of the barrier may be in direct contact with the solder resist 122, and a second surface 134 may be in direct contact with the mold layer 142. In an embodiment, the first surface 135 is substantially flat, and the second surface 134 is rounded or domed. This is indicative of the barrier 131 being printed on the second package 120, and then brought into contact with the first package 140 during assembly. In an embodiment, the air gap 136 may be entirely surrounded by the barrier 131. That is, the barrier 131 may be a ring. Such a configuration prevents materials, such as flux from the TMIs 143, from migrating towards the die region.

Figure 1B:
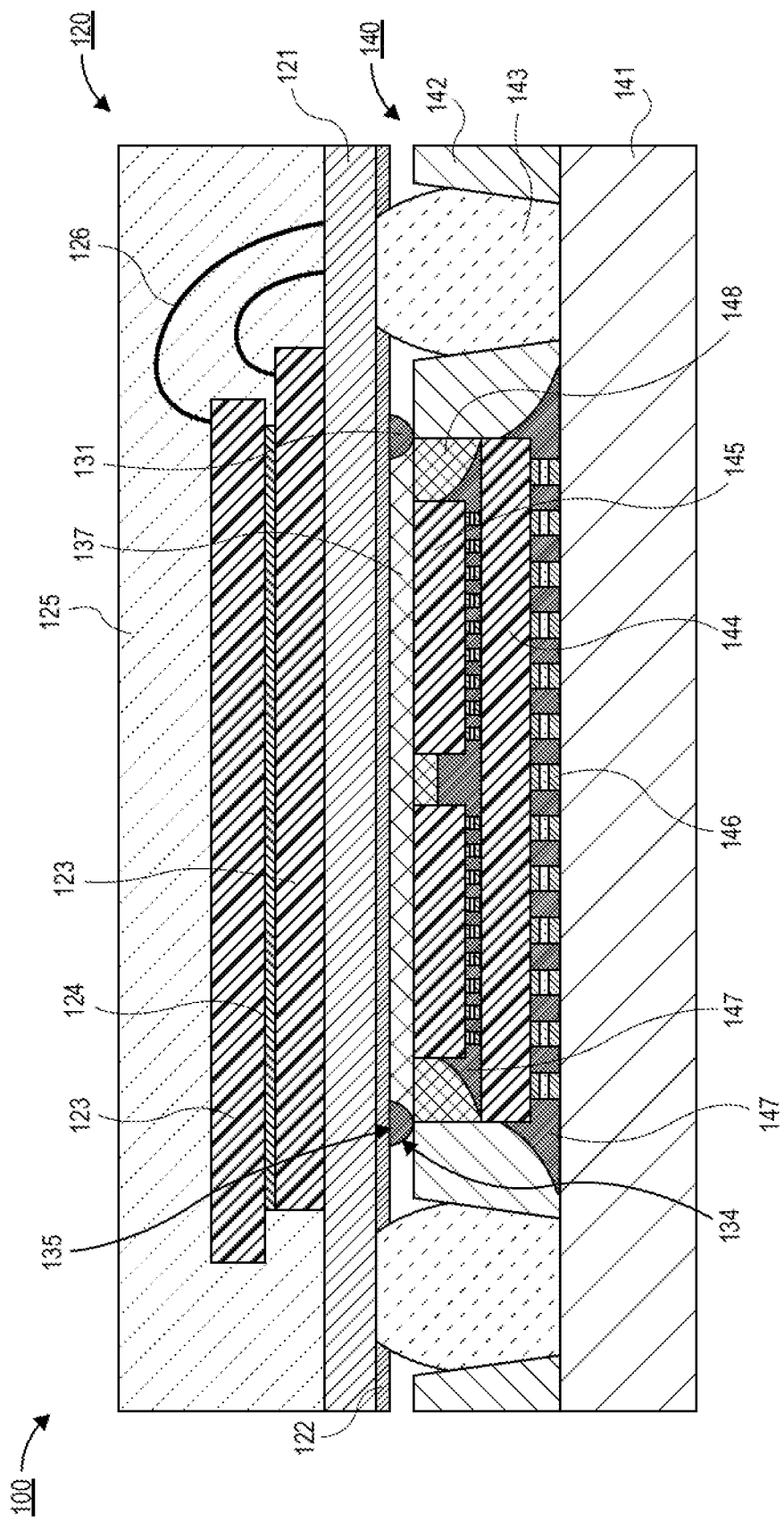
FIG. 1B is a cross-sectional illustration of an electronic package with a PoP architecture that includes a barrier that confines a thermal adhesive between a first package and a second package, in accordance with an embodiment.

Referring now to FIG. 1B, a cross-sectional illustration of an electronic package 100 is shown, in accordance with an additional embodiment. In an embodiment, the electronic package 100 in FIG. 1B may be substantially similar to the electronic package 100 in FIG. 1A, with the exception that the air gap 136 is filled with a thermal interface material. For example, a thermal adhesive 137 may fill the gap between the first package 140 and the second package 120. The thermal adhesive 137 may be in direct contact with the solder resist layer 122 of the second package 120. The opposing surface of the thermal adhesive 137 may be in direct contact with surfaces of the second dies 145 of the first package 140. Accordingly, the thermal resistance between the first package 140 and the second package 120 is substantially reduced by the presence of the thermal adhesive 137. In an embodiment, the thermal adhesive 137 conforms to the surface of the barrier 131. That is, sidewalls of the thermal adhesive 137 are in direct contact with portions of the barrier 131. Accordingly, the sidewalls of the thermal adhesive 137 may not be substantially vertical. For example, the sidewalls of the thermal adhesive 137 shown in FIG. 1B include a curved profile.

In an embodiment, the thermal adhesive 137 is entirely surrounded by the barrier 131. As such, the thermal adhesive 137 is prevented from flowing into the TMI region of the electronic package 100. This is particularly beneficial, since the presence of the thermal adhesive 137 around the TMIs 143 may result in solder extrusions or other manufacturing defects. Accordingly, containing the flow of the thermal adhesive 137 with the barrier 131 improves the yield.

Figure 1C:
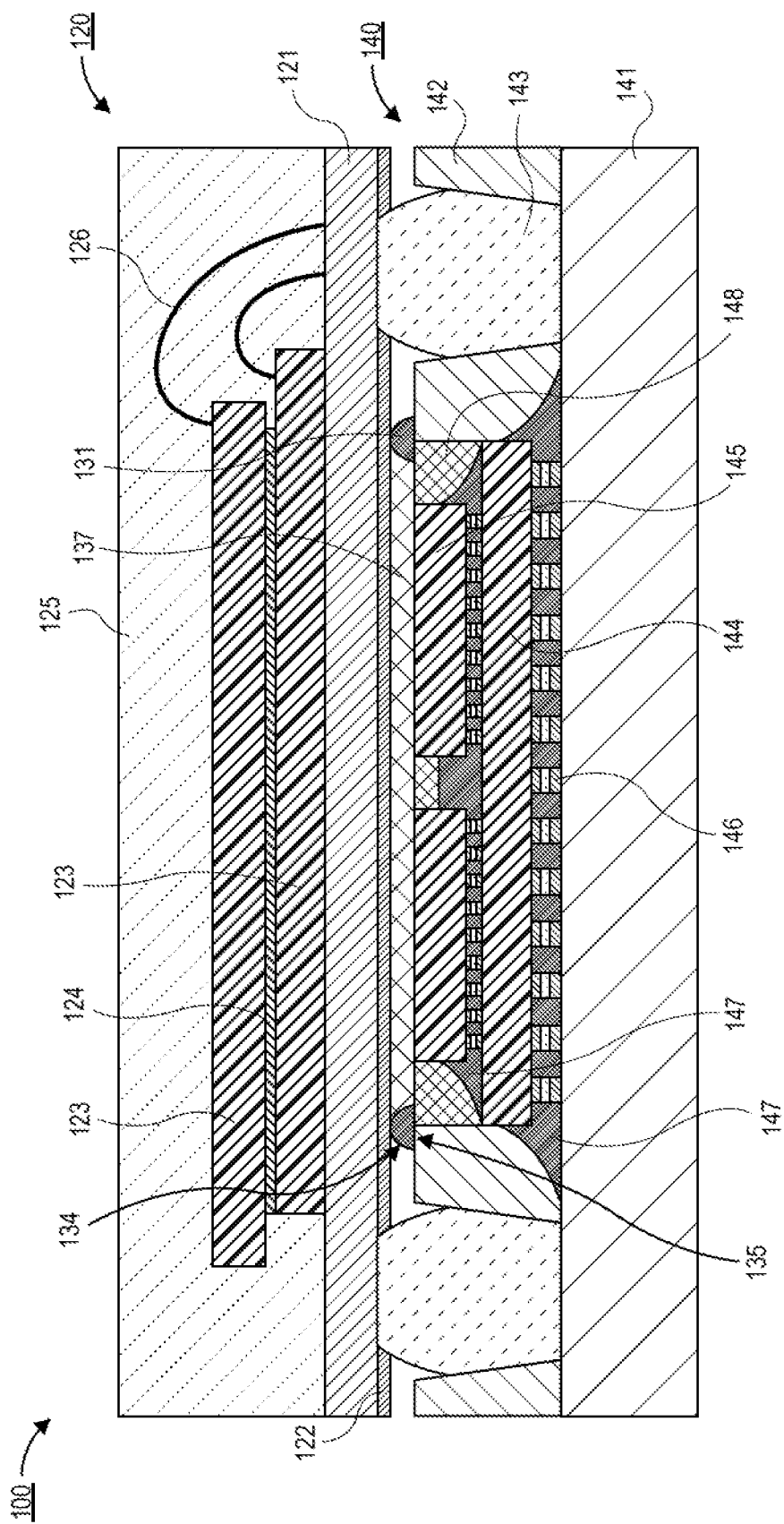
FIG. 1C is a cross-sectional illustration of an electronic package with a PoP architecture that includes a barrier between a first package and a second package, in accordance with an additional embodiment.

Referring now to FIG. 1C, a cross-sectional illustration of an electronic package 100 is shown, in accordance with an additional embodiment. In an embodiment, the electronic package 100 in FIG. 1C is substantially similar to the electronic package 100 in FIG. 1B, with the exception that the barrier 131 is oriented in a different direction. Particularly, embodiments may include a barrier 131 with a first surface 135 that is in direct contact with the first electronic package 140, and a second surface 134 that is in direct contact with the second package 120. Particularly, the first surface 135 may be substantially flat and be in contact with the first and/or second mold layer 142/148, and the second surface 134 may be curved or domed and be in contact with the solder resist 122 of the second package 120. Such a configuration may be indicative of the barrier 131 being printed onto the first package 140.

Figure 2A:
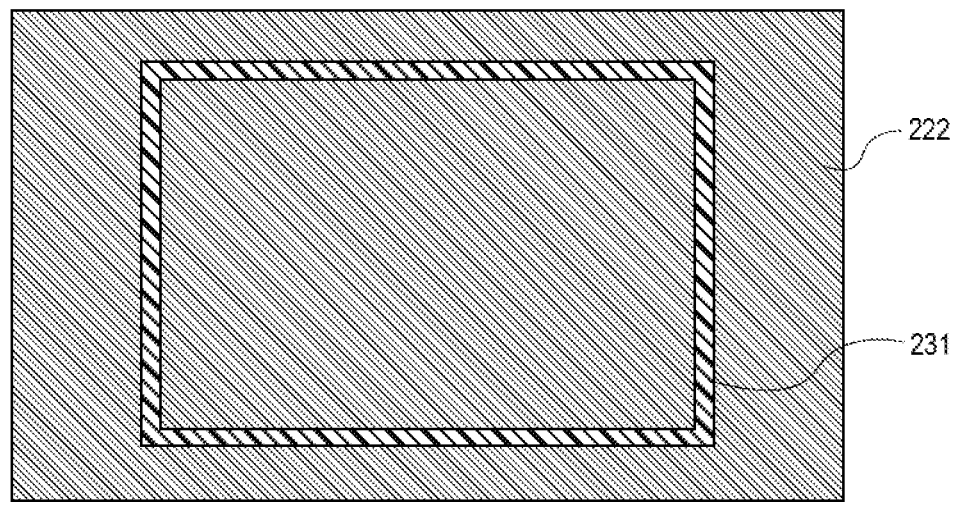
FIG. 2A is a plan view illustration of a bottom surface of an electronic package that includes a barrier that is a ring, in accordance with an embodiment.
Figure 2B:
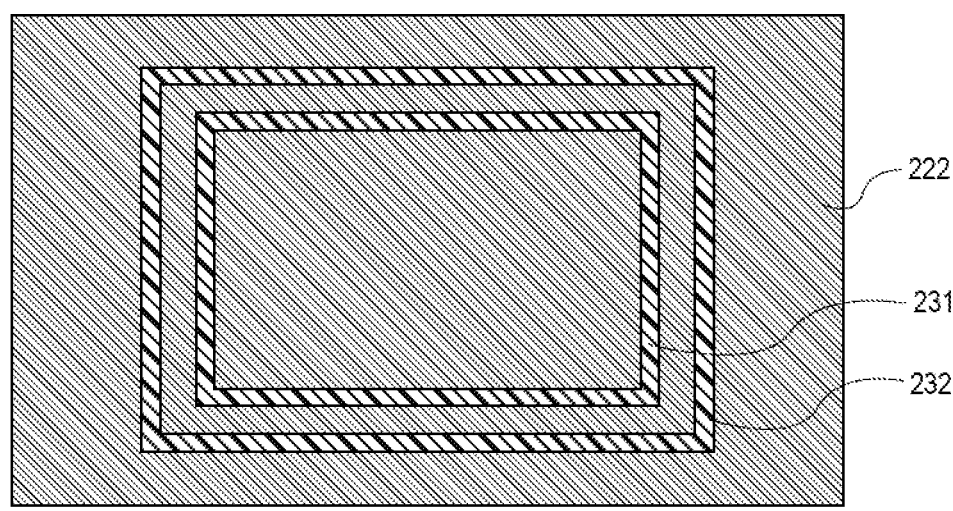
FIG. 2B is a plan view illustration of a bottom surface of an electronic package that includes a first barrier ring and a second barrier ring, in accordance with an embodiment.
Figure 2C:
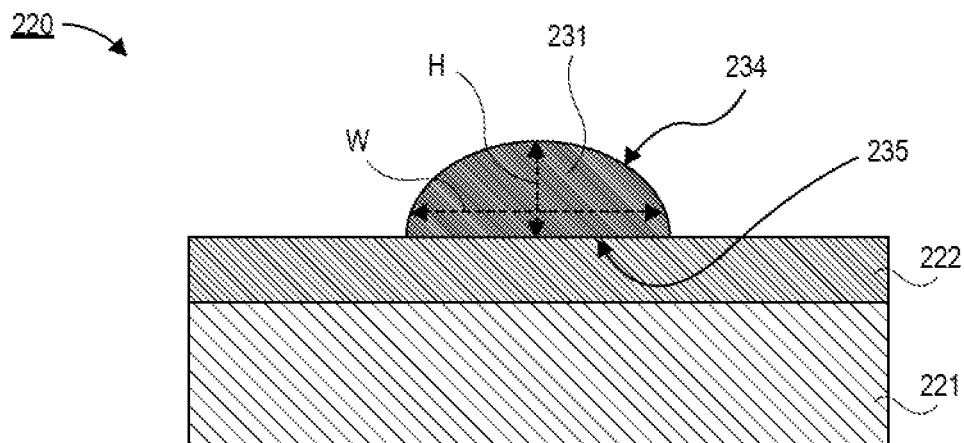
FIG. 2C is a cross-sectional illustration of an electronic package that illustrates a profile of the barrier, in accordance with an embodiment.

Referring now to FIGS. 2A-2C, plan view illustrations and a cross-sectional illustration of a portion of a top package 220 with a barrier 231 are shown in accordance with various embodiments in order to more clearly illustrate the barrier 231. Particularly, the illustrations are simplified in order to show only the solder resist layer 222 and the barrier 231. However, it is to be appreciated that solder balls for the TMI interconnects may surround the barrier 231. Additionally, while a top package 220 of a PoP architecture is shown, it is to be appreciated that embodiments may also include substantially similar barrier configurations on the bottom package of a PoP architecture.

Referring now to FIG. 2A, a plan view illustration of the bottom surface of a second package 220 is shown, in accordance with an embodiment. In an embodiment, the bottom surface may include a solder resist layer 222. A barrier 231 may be disposed over the solder resist layer 222. As shown, the barrier 231 may form a continuous ring. In the illustrated embodiment, the barrier 231 is shown as having a substantially rectangular shape. However, it is to be appreciated that embodiments may include a barrier 231 with any shape. For example, the barrier 231 may include chamfers or the like to account for any substrate features.

Referring now to FIG. 2B, a plan view illustration of the bottom surface of a second package 220 is shown, in accordance with an additional embodiment. As shown, a first barrier 231 and a second barrier 232 are provided over the solder resist 222. The inclusion of a first barrier 231 and a second barrier 232 improves the ability to prevent a thermal adhesive from spreading out towards the TMI regions. For example, if the first barrier 231 is breached by the thermal adhesive, then the second barrier 232 is still present to restrict the flow of the thermal adhesive. In the illustrated embodiment, the first barrier 231 and the second barrier 232 are shown as being substantially concentric with each other. However, it is to be appreciated that the shapes of the first barrier 231 and the second barrier 232 need not be substantially similar, nor does the first barrier 231 need to be substantially centered within the second barrier 232.

Referring now to FIG. 2C, a cross-sectional illustration of a portion of a second package 220 is shown, in accordance with an embodiment. FIG. 2C more clearly illustrates the profile of the barrier 231. As shown, the barrier 231 may have a first surface 235 that is supported by the solder resist 222 that is over the package substrate 221. That is, the first surface 235 may be substantially flat. In an embodiment, the second surface 234 of the barrier 231 may be curved or dome shaped. The extent of the curvature of the second surface 234 may be controlled by changing the printing conditions and/or the composition of the material used for the barrier 231.

In an embodiment, the barrier 231 may have a height H and a width W. In an embodiment, the width W may be greater than the height H. However, in other embodiments, the width W may be substantially equal to or less than the height H. In a particular embodiment, a ratio of the width W to the height H (W:H) may be approximately 2:1 or greater, 5:1 or greater, or 10:1 or greater. For example, the width W may be approximately 200 µm and the height H may be approximately 20 µm.

Figure 3A:
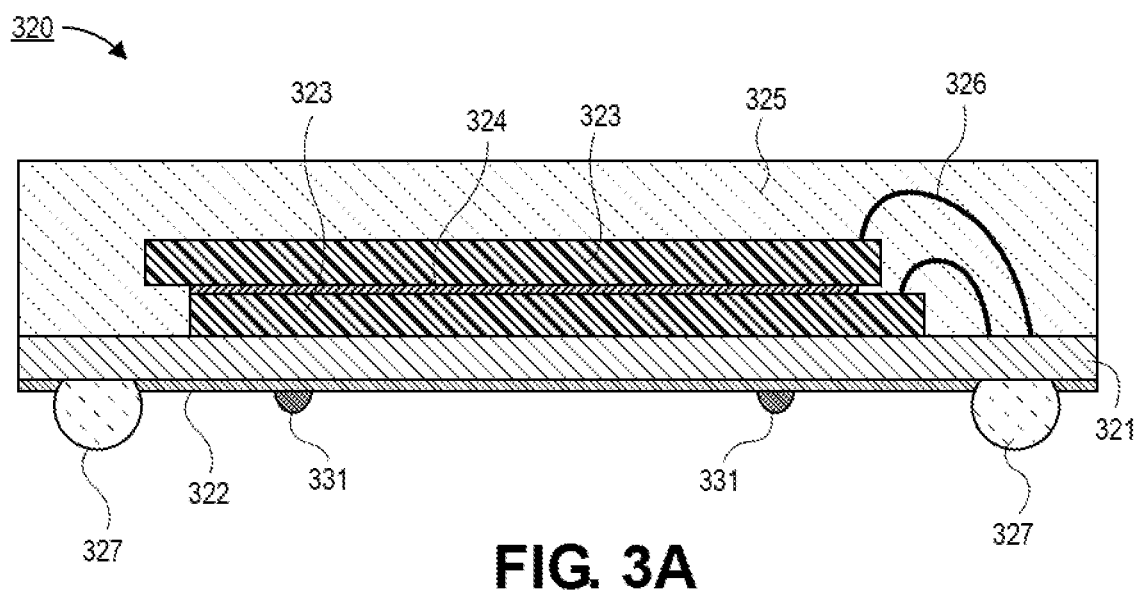
FIG. 3A is a cross-sectional illustration of a top package of a PoP architecture that includes a barrier, in accordance with an embodiment.
Figure 3B:
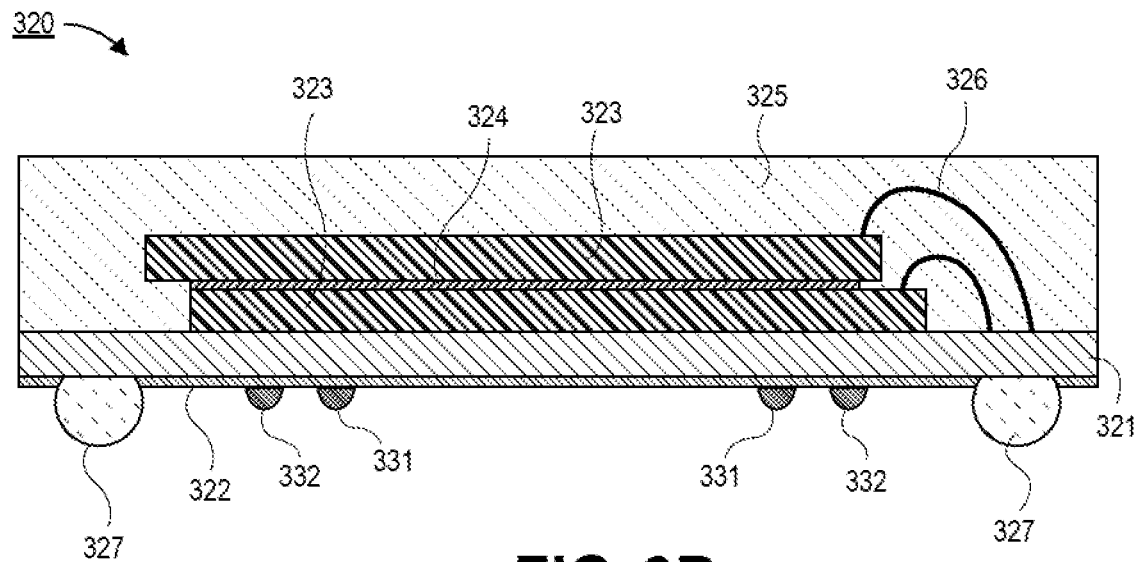
FIG. 3B is a cross-sectional illustration of a top package of a PoP architecture that includes a first barrier and a second barrier, in accordance with an embodiment.
Figure 3C:
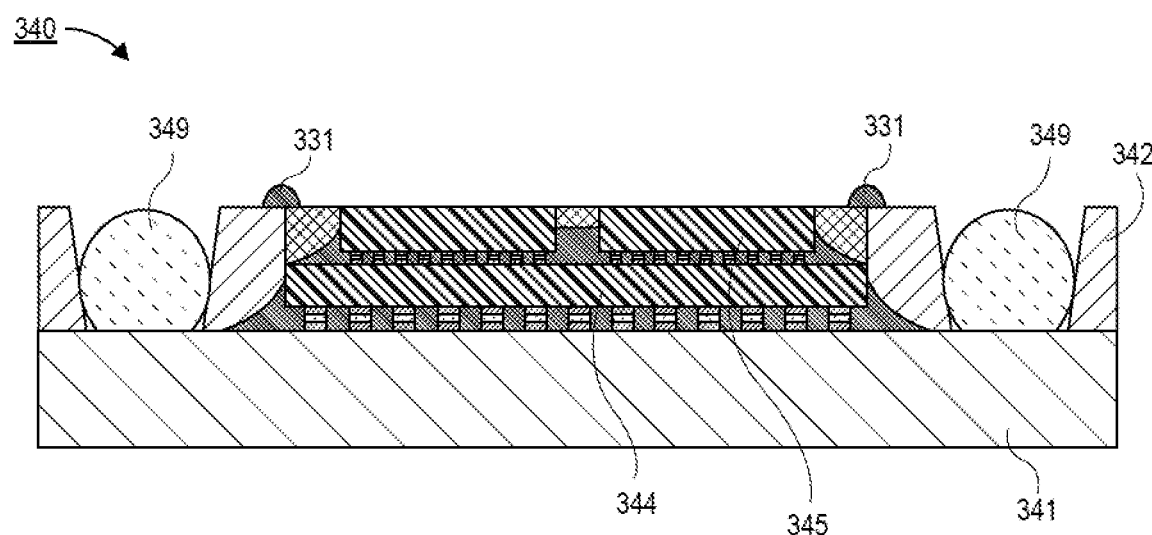
FIG. 3C is a cross-sectional illustration of a bottom package of a PoP architecture that includes barrier, in accordance with an embodiment.

Referring now to FIGS. 3A-3C, a series of cross-sectional illustrations depicting barriers 331 over first packages 340 and second packages 320 is shown, in accordance with an embodiment. FIGS. 3A and 3B illustrate barriers over a second package 320, and FIG. 3C illustrates a barrier 331 over a first package 340.

Referring now to FIG. 3A, a cross-sectional illustration of a second (top) package 320 is shown, in accordance with an embodiment. In an embodiment, the second package 320 may be a memory package that comprises one or more memory dies 323. For example, a pair of memory dies 323 attached together by a DAF 324 is shown in FIG. 3A. The memory dies 323 may be electrically coupled to a package substrate 321 by wire bonds 326. A mold layer 325 may embed the memory dies 323 and the wire bonds 326.

In an embodiment, a solder resist 322 is disposed over a backside surface of the package substrate 321 opposite from the mold layer 325. A plurality of solder balls 327 may pass through the solder resist 322 to contact the package substrate 321. The solder balls 327 may be positioned along the edges of the package substrate 321. While a single row of solder balls 327 are shown along each edge, it is to be appreciated that any number of rows of solder balls 327 may be used, depending on the needs of the PoP system. In an embodiment, a flux (not shown) may be applied to the solder balls 327 to aid in the formation of the TMI.

In an embodiment, a barrier 331 may be disposed over the solder resist 322. The barrier 331 separates an interior surface area of the solder resist 322 from the region with the solder balls 327. Accordingly, a thermal adhesive (not shown) or the like may be disposed within the barrier 331 without risking the spread of the thermal adhesive around the solder balls 327. In an embodiment, the barrier 331 also prevents the flux from flowing in towards a center of the second package 320.

Referring now to FIG. 3B, a cross-sectional illustration of a second (top) package 320 is shown, in accordance with an additional embodiment. In an embodiment, the second package 320 in FIG. 3B is substantially similar to the second package 320 in FIG. 3A, with the exception of there being a first barrier 331 and a second barrier 332. In an embodiment, the first barrier 331 may be surrounded by the second barrier 332. Accordingly, there is improved protection against thermal adhesive spreading out towards the solder balls 327, because there are now two barriers 331 and 332 that confine the thermal adhesive. For example, the second barrier 332 would prevent unwanted flow of a thermal adhesive if the first barrier 331 ever fails.

Referring now to FIG. 3C, a cross-sectional illustration of a first (bottom) package 340 is shown, in accordance with an embodiment. The first package 340 may comprise a package substrate 341 and a plurality of dies 344 and 345 over the package substrate 341. A mold layer 342 may be disposed over the package substrate 341, and the mold layer 342 may embed the dies 344 and 345. In an embodiment, a TMI solder 349 may be disposed in openings through the mold layer 342.

In an embodiment, the first package 340 may comprise a barrier 331 over the mold layer 342. In an embodiment, the barrier 331 surrounds the perimeter of the dies 345. Accordingly, there is a die region inside the perimeter of the barrier 331 and a TMI region with TMI solder 349 outside the perimeter of the barrier 331. Accordingly, a thermal adhesive (not shown) may be confined to the die region. Furthermore, while a single barrier 331 is shown, it is to be appreciated that a second barrier (similar to the second barrier 332 in FIG. 3B) may also be printed around the perimeter of the barrier 331 to provide additional protection.

In FIGS. 3A-3C, the barriers 331/332 are shown as being printed on either the top package 320 or the bottom package 340. However, it is to be appreciated that in some embodiments, a first barrier 331 may be printed on the top package, and a second barrier 332 may be printed on the bottom package. That is, the one or more barriers 331/332 may be printed on multiple surfaces of a PoP architecture.

Figure 4A:
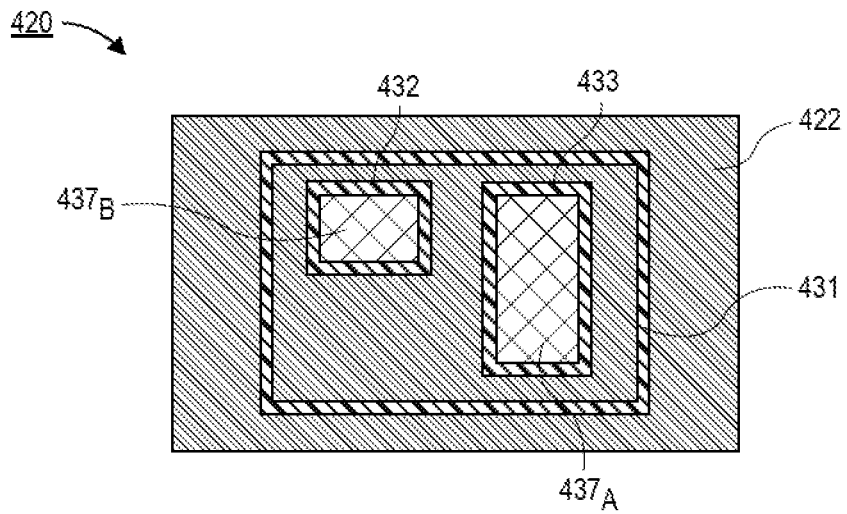
FIG. 4A is a plan view illustration of an electronic package with a plurality of barriers, in accordance with an embodiment.
Figure 4B:
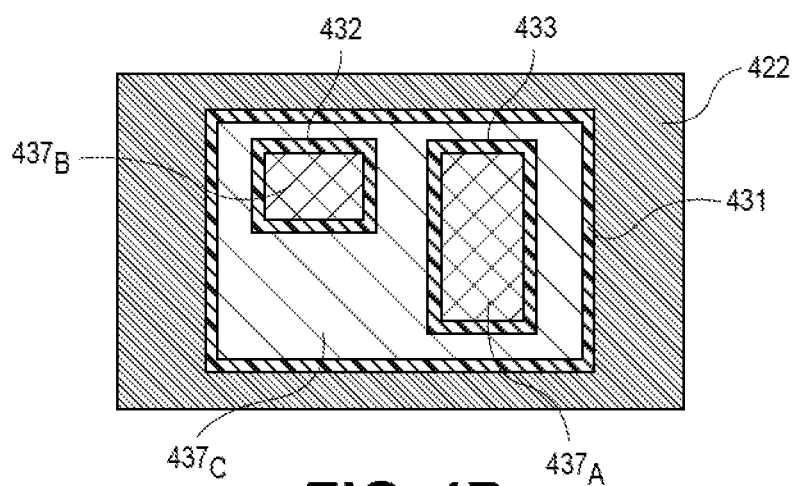
FIG. 4B is a plan view illustration of an electronic package with a plurality of barriers, in accordance with an additional embodiment.
Figure 4C:
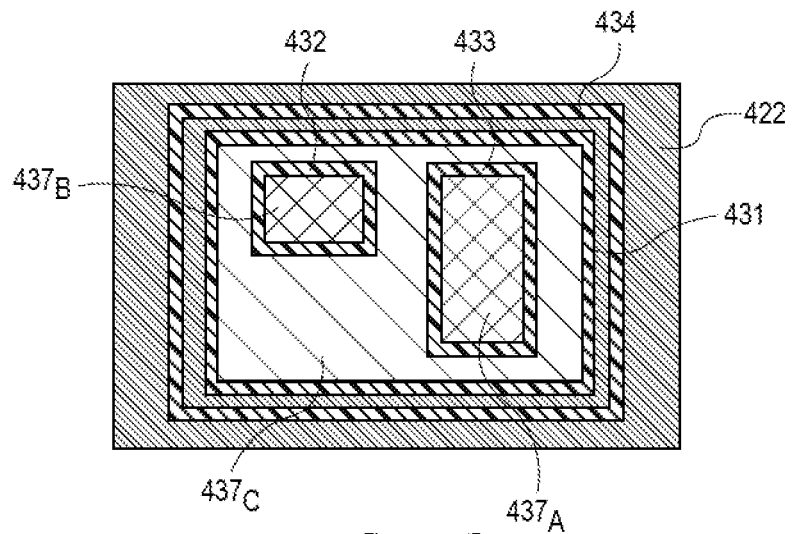
FIG. 4C is a cross-sectional illustration of an electronic package with a plurality of barriers, in accordance with an additional embodiment.

Referring now to FIGS. 4A-4C, a series of plan view illustrations of an electronic package 420 is shown, in accordance with various embodiments. While examples of a top package are shown, it is to be appreciated that similar barrier and thermal adhesive configurations may also be implemented on the bottom package.

Referring now to FIG. 4A, a plan view illustration of the bottom of an electronic package 420 is shown, in accordance with an embodiment. As shown, a plurality of barriers (e.g., first barrier 431, second barrier 432, and third barrier 433) may be disposed over a solder resist layer 422. In an embodiment, the second barrier 432 and the third barrier 433 may be within a perimeter of the first barrier 431. In an embodiment, the second barrier 432 and the third barrier 433 may be filled with thermal adhesives $437_A$ and $437_B$. Isolating the thermal adhesive 437 to various locations within the first barrier 431 may be used to improve thermal performance. For example, the thermal adhesives 437 may be isolated to hot spot locations of the electronic system. Hot spot locations may include portions of the one or more dies in the bottom package (not shown) that dissipate more heat, (e.g., due to the presence of an increased density of transistors, or the like).

In the illustrated embodiment, a pair of interior barriers (i.e., barrier 432 and barrier 433) are shown. However, it is to be appreciated that any number of interior barriers may be provided, depending on the needs of the electronic package 420. Furthermore, while shown as being substantially rectangular, it is to be appreciated that the interior barriers 432/433 may include any shape. In an embodiment, the thermal adhesive $437_A$ may have a material composition that is substantially similar to the material composition of the thermal adhesive $437_B$. However, in other embodiments, the thermal adhesives $437_A$ and $437_B$ may have different material compositions.

Referring now to FIG. 4B, a plan view illustration of the bottom of an electronic package 420 is shown, in accordance with an additional embodiment. The electronic package 420 in FIG. 4B may be substantially similar to the electronic package 420 in FIG. 4A, with the exception that a third thermal adhesive $437_C$ fills the remaining portion of the first barrier 431. In an embodiment, the third thermal adhesive $437_C$ may have a different material composition than the first thermal adhesive $437_A$ and the second thermal adhesive $437_B$. In a particular embodiment, the first thermal adhesive $437_A$ and the second thermal adhesive $437_B$ may have a lower thermal resistance than the third thermal adhesive $437_C$.

Referring now to FIG. 4C, a plan view illustration of the bottom of an electronic package 420 is shown, in accordance with an additional embodiment. The electronic package 420 in FIG. 4C may be substantially similar to the electronic package 420 in FIG. 4B, with the exception that a fourth barrier 434 is around a perimeter of the first barrier 431. The inclusion of a fourth barrier 434 provides additional protection from the thermal adhesives 437 bleeding out into the TMI regions of the electronic package 420.

Figure 5:
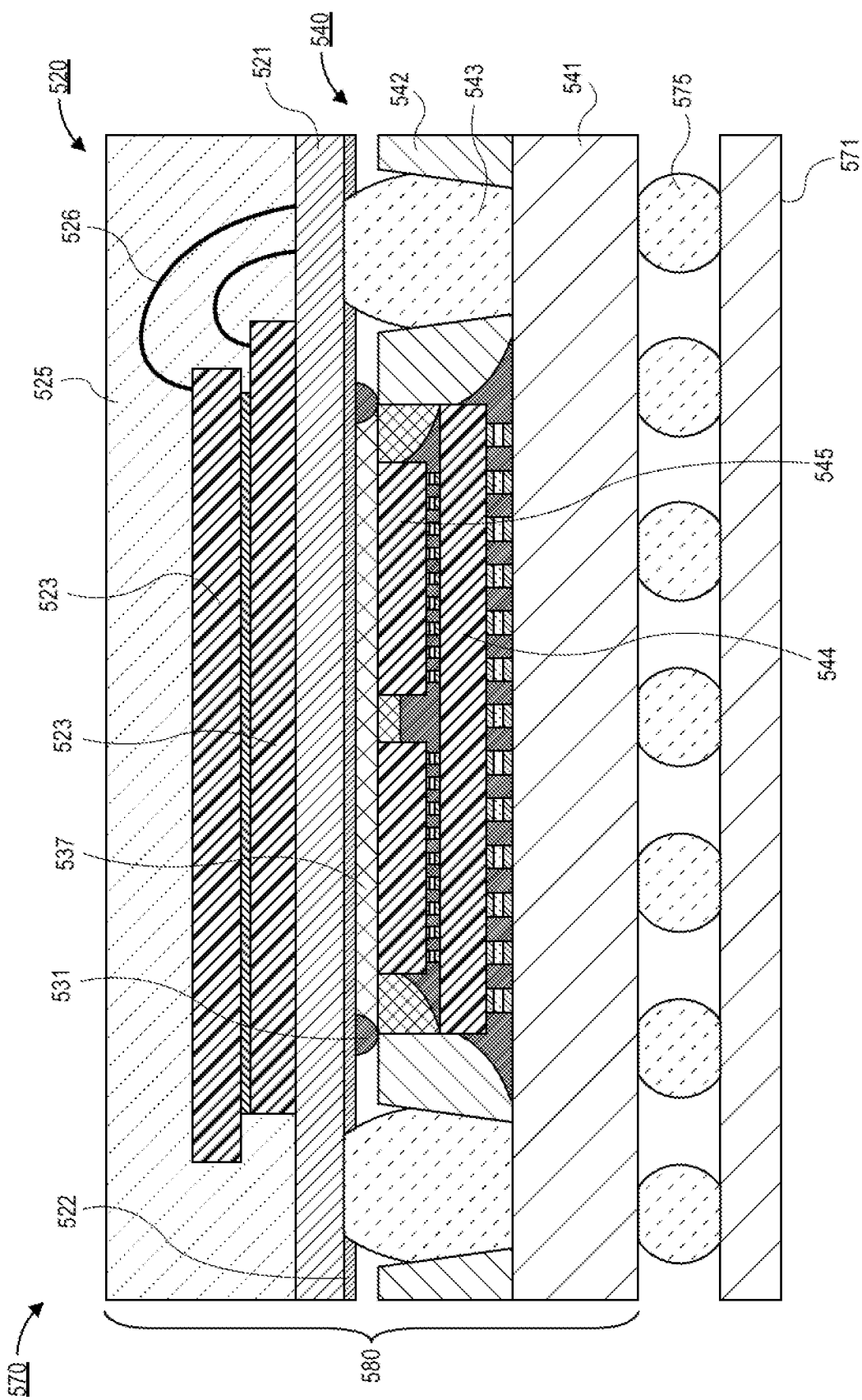
FIG. 5 is a cross-sectional illustration of an electronic system that includes a PoP architecture with a barrier between the top package and the bottom package, in accordance with an embodiment.

Referring now to FIG. 5, a cross-sectional illustration of an electronic system 570 is shown, in accordance with an embodiment. In an embodiment, the electronic system 570 comprises a board 571. The board 571 may be a printed circuit board (PCB) or the like. In an embodiment, a PoP package 580 may be electrically coupled to the board 571 with interconnects 575. For example, the interconnects 575 may be solder balls, or any other suitable interconnect architecture.

In an embodiment, the PoP package 580 comprises a bottom package 540 and a top package 520. The bottom package comprises a package substrate 541 and a plurality of dies 544/545 attached to the package substrate. A mold layer 542 may embed the plurality of dies 544/545. In an embodiment, a TMI 543 may pass through the mold layer 542. The TMI 543 may be electrically coupled to one or more of the dies 544/545 by conductive features (e.g., traces, vias, pads, etc.) in the package substrate (not shown).

In an embodiment, the top package 520 may comprise a package substrate 521 with a solder resist layer 522 over the package substrate 521. The solder resist layer 522 may have an opening through which the TMI 543 contacts the package substrate 521. In an embodiment, the top package 520 may comprise one or more dies 523 that are connected to the package substrate 521 by wire bonds 526. The top package 520 may also comprise a mold layer 525 that embeds the dies 523.

In an embodiment, a barrier 531 may be disposed between the top package 520 and the bottom package 540. The barrier 531 may be in direct contact with the solder resist 522 of the top package 520 and with the mold layer 542 of the bottom package 540. The barrier 531 may be a ring that confines a thermal adhesive 537. The thermal adhesive 537 may be over the plurality of dies 544/545 of the bottom package 540 in order to improve thermal performance. The barrier 531 prevents the thermal adhesive 537 from flowing into the TMI regions where the TMIs 543 are located.

Figure 6:
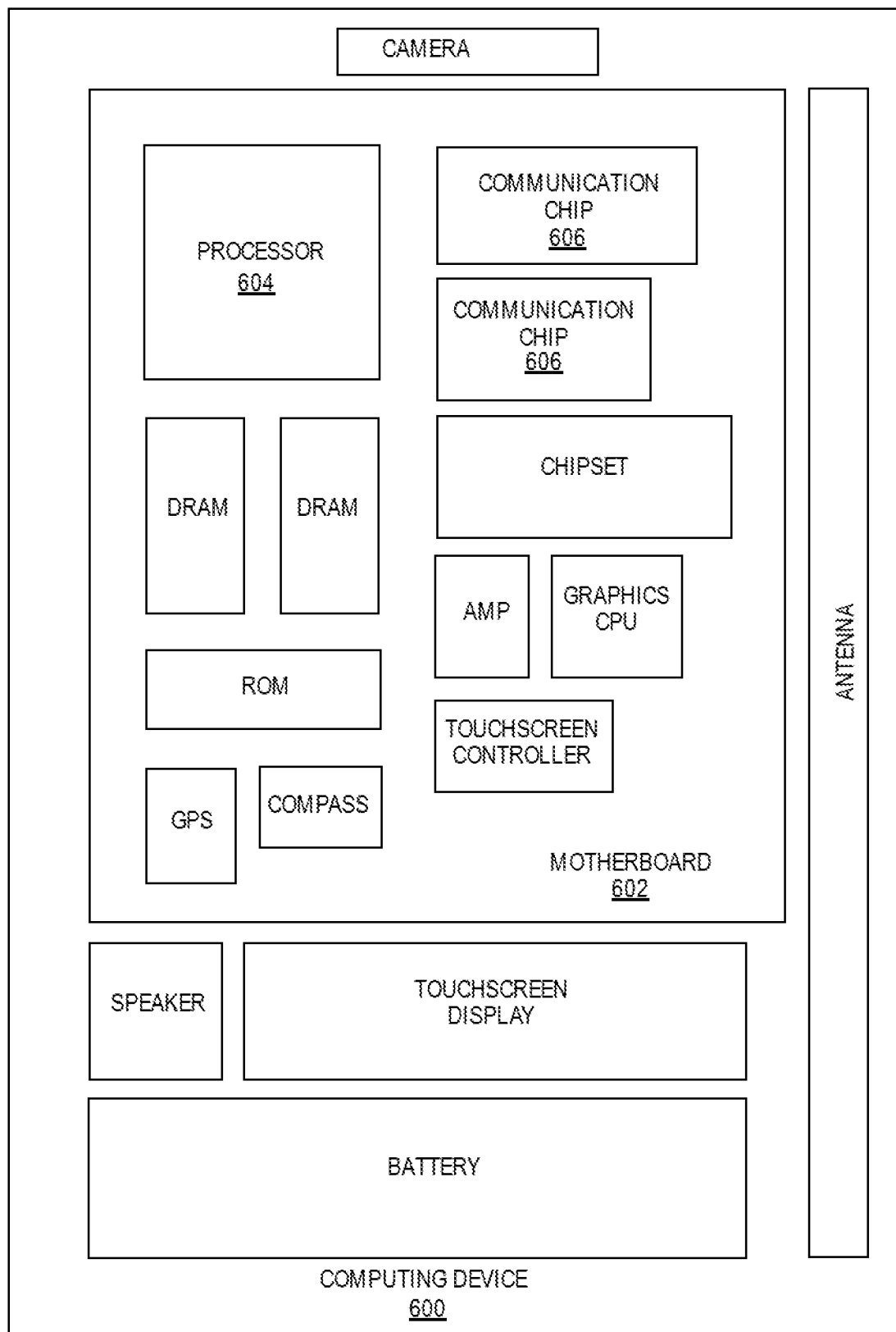
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor 604 may be part of an electronic package that comprises a thermal adhesive that is bordered by a barrier, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip 606 may be part of an electronic package that comprises a thermal adhesive that is bordered by a barrier, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first package; a second package over the first package and electrically coupled to the first package; and a barrier between the first package and the second package.

Example 2: the electronic package of Example 1, wherein the barrier has a flat surface and a domed surface.

Example 3: the electronic package of Example 2, wherein the first package is in contact with the domed surface of the barrier, and wherein the second package is in contact with the flat surface of the barrier.

Example 4: the electronic package of Example 2, wherein the first package is in contact with the flat surface of the barrier, and wherein the second package is in contact with the domed surface of the barrier.

Example 5: the electronic package of Examples 1-4, wherein the barrier is a ring.

Example 6: the electronic package of Example 5, wherein an interior of the ring is filled with a thermal adhesive.

Example 7: the electronic package of Examples 1-6, further comprising: a second barrier between the first package and the second package.

Example 8: the electronic package of Example 7, wherein the second barrier surrounds the barrier.

Example 9: the electronic package of Examples 1-8, further comprising: a plurality of barriers between the first package and the second package.

Example 10: the electronic package of Example 9, wherein each barrier of the plurality of barriers is a ring, and wherein each ring is filled with a thermal adhesive.

Example 11: the electronic package of Example 10, wherein a first thermal adhesive in a first barrier ring is different than a second thermal adhesive in a second barrier ring.

Example 12: the electronic package of Examples 1-11, wherein the barrier comprises acrylic polymers and $TiO_2$.

Example 13: the electronic package of Examples 1-12, wherein the first package is a system-on-chip (SoC) package and wherein the second package is a memory package.

Example 14: an electronic package, comprising: a first package, wherein the first package comprises: a first package substrate; a first die over the first package substrate; a first mold layer over the first package substrate and around the first die; and a plurality of through mold interconnects (TMIs) through the first mold layer; a second package electrically coupled the first package by the TMIs, wherein the second package comprises: a second package substrate; a second die over the second package substrate; and a solder resist over a surface of the second package substrate opposite from the second die; and a barrier between the first package and the second package.

Example 15: the electronic package of Example 14, wherein the barrier is a ring, and wherein the ring is within a boundary defined by the TMIs.

Example 16: the electronic package of Example 15, wherein the ring is filled with a thermal adhesive, wherein the thermal adhesive is in contact with the first package and the second package.

Example 17: the electronic package of Example 15 or Example 16, further comprising: a second barrier around the barrier.

Example 18: the electronic package of Examples 14-17, wherein the barrier has a flat surface and a domed surface.

Example 19: the electronic package of Example 18, wherein the first package is in contact with the domed surface of the barrier, and wherein the second package is in contact with the flat surface of the barrier.

Example 20: the electronic package of Example 18, wherein the first package is in contact with the flat surface of the barrier, and wherein the second package is in contact with the domed surface of the barrier.

Example 21: the electronic package of Examples 14-20, further comprising: a board, wherein the board is electrically coupled to the first package.

Example 22: the electronic package, comprising: a package substrate with a first surface and a second surface opposite from the first surface; a plurality of dies attached to the first surface of the package substrate, wherein the plurality of dies are electrically coupled to the package substrate by wire bonds; a solder resist layer over the second surface of the package substrate; solder balls attached to the package substrate through the solder resist layer; and a barrier ring over the solder resist layer and within a perimeter of the solder balls, wherein the barrier ring comprises a flat surface that is in direct contact with the solder resist layer and a domed surface.

Example 23: the electronic package of Example 22, further comprising: a plurality of barrier rings.

Example 24: an electronic package, comprising: a package substrate; a first die on the package substrate; a plurality of second dies over the first die; a mold layer over the package substrate, the first die, and the plurality of second dies, wherein backside surfaces of the plurality of second dies are exposed; a plurality of through mold interconnects (TMIs) around the first die; and a barrier ring surrounding the exposed backside surfaces of the plurality of second dies.

Example 25: the electronic package of Example 24, further comprising: a plurality of barrier rings.

What is claimed is:

1. An electronic package, comprising:
a package substrate having a top side and an opposite bottom side;
a first die coupled to the top side of the package substrate by first interconnects;
a first underfill material around the first interconnects and along a first sidewall and a second sidewall of the first die;
a second die over and coupled to the first die by second interconnects, the second die within a footprint of the first die;
a third die over and coupled to the first die by third interconnects, the third die laterally spaced apart from the second die, and the third die within the footprint of the first die;
a second underfill material around the second interconnects and the third interconnects, the second underfill material laterally between and in contact with the second die and the third die; and
a mold layer on the second underfill material, the mold layer having a first sidewall in vertical alignment with the first sidewall of the first die, and the mold layer having a second sidewall in vertical alignment with the second sidewall of the first die.

2. The electronic package of claim 1, further comprising:
a structure over the second die and the third die, the structure comprising a metal.

3. The electronic package of claim 2, further comprising:
a thermal adhesive between the second die and the structure and between the third die and the structure.

4. The electronic package of claim 1, further comprising:
a conductive structure laterally spaced apart from the first die and the second die.

5. The electronic package of claim 1, wherein the first underfill material is only partially along each of the first sidewall and the second sidewall of the first die.

6. The electronic package of claim 1, wherein the second underfill material is only partially along a sidewall of the second die and only partially along a sidewall of the third die.

7. The electronic package of claim 1, wherein the mold layer is laterally between the second die and the third die.

8. A method of fabricating an electronic package, the method comprising:
providing a first die;
coupling a second die to the first die by first upper interconnects, the second die within a footprint of the first die;
coupling a third die to the first die by second upper interconnects, the third die within the footprint of the first die, and the third die laterally spaced apart from the second die;
forming an upper underfill material around the first interconnects and the second upper interconnects, the upper underfill material laterally between and in contact with the second die and the third die;
forming a mold layer on the upper underfill material, the mold layer having a first sidewall in vertical alignment with a first sidewall of the first die, and the mold layer having a second sidewall in vertical alignment with a second sidewall of the first die
coupling the first die to a package substrate with lower interconnects; and
forming a lower underfill material around the lower interconnects and along the first sidewall and the second sidewall of the first die.

9. The method of claim 8, further comprising:
providing a structure over the second die and the third die, the structure comprising a metal.

10. The method of claim 9, further comprising:
forming a thermal adhesive between the second die and the structure and between the third die and the structure.

11. The method of claim 8, further comprising:
forming a conductive structure laterally spaced apart from the first die and the second die.

12. The method of claim 8, wherein the lower underfill material is only partially along each of the first sidewall and the second sidewall of the first die.

13. The method of claim 8, wherein the upper underfill material is only partially along a sidewall of the second die and only partially along a sidewall of the third die.

14. The method of claim 8, wherein the mold layer is laterally between the second die and the third die.

* * * * *